United States Patent [19]

Yamamoto et al.

[11] Patent Number: 4,969,025
[45] Date of Patent: Nov. 6, 1990

[54] AMORPHOUS SILICON PHOTOSENSOR WITH OXYGEN DOPED LAYER

[75] Inventors: Kenji Yamamoto, Miyagi; Atsuko Kumagai, Sendai; Koichi Haga, Miyagi, all of Japan

[73] Assignees: Ricoh Company, Ltd., Tokyo; Ricoh Research Institute of General Electronics, Miyagi, both of Japan

[21] Appl. No.: 411,263

[22] Filed: Sep. 25, 1989

Related U.S. Application Data

[63] Continuation of Ser. No. 148,917, Jan. 27, 1988, abandoned.

[30] Foreign Application Priority Data

Jan. 27, 1987 [JP] Japan .................................. 62-16710

[51] Int. Cl.$^5$ ............................................. H01L 27/14
[52] U.S. Cl. .......................................... 357/30; 357/2; 357/67; 357/71; 357/59; 357/31; 357/63
[58] Field of Search ................. 357/30 K, 30 G, 30 D, 357/30 Q, 30 I, 2, 63, 31, 71 P, 71 S, 67 S, 59 B, 59 C, 59 D, 59 I, 59 J, 59 G

[56] References Cited

U.S. PATENT DOCUMENTS

| 4,460,670 | 7/1984 | Ogawa et al. ................ 357/30 K X |
| 4,581,476 | 4/1986 | Yamazaki ........................ 357/30 K |
| 4,667,214 | 5/1987 | Sekimura et al. ................ 357/30 K |
| 4,682,019 | 7/1987 | Nakatsui et al. ............. 357/30 K X |
| 4,726,851 | 2/1988 | Matsumura .................... 357/30 K X |
| 4,738,729 | 4/1988 | Yoshida et al. .............. 357/30 K X |

FOREIGN PATENT DOCUMENTS 0595629 1/1984 Japan ................................ 357/30 K

OTHER PUBLICATIONS

Sequeda, "The Role of Thin Film Materials on the Technology of Integrated Circuit Fabrication," *Journal of Metals*, Nov. 85, 54–59.

Primary Examiner—William Mintel
Attorney, Agent, or Firm—Oblon, Spivak, McClelland, Maier & Neustadt.

[57] ABSTRACT

A sandwich type amorphous silicon photosensor suitable for use as an image sensor of a facsimile machine or the like is provided. The photosensor includes a pair of first and second electrodes and an amorphous silicon multi-layer structure sandwiched between the first and second electrodes. The first electrode includes an oxide and has a transparency of 80% or more in a visible light region. The multi-layer structure includes a first amorphous silicon layer which is in contact with the first electrode. The first amorphous silicon layer contains at least oxygen and has an optical bandgap in a region of 2.0 eV or more, a resistivity in a range of $10^{12}$–$10^{14}$ ohms-cm, a photoconductive characteristic and a refractive index in a range of 1.8–3.4

14 Claims, 2 Drawing Sheets

AMORPHOUS SILICON PHOTOSENSOR WITH OXYGEN DOPED LAYER

This application is a Continuation of application Ser. No. 07/148,917, filed on Jan. 27, 1988, now abandoned.

BACKGROUND OF THE INVENTION

1. Field of the Invention

This invention generally relates to a photosensor for converting light information into an electrical signal, and, in particular, to an amorphous silicon photosensor having a multi-layer, sandwich type structure in which two or more amorphous silicon layers are sandwiched between a pair of electrodes. More specifically, the present invention relates to a photosensor suitable for use as an image sensor in the likes of a facsimile machine.

2. Description of the Prior Art

Photosensors are well known in the art and they may be classified into those of the CdS-CdSe family and those of the Se-Te-As family. However, in the case of the CdS-CdSe family, the light response speed is relatively slow; whereas, in the case of photosensors of the Se-Te-As family, these photosensors exhibit the drawback of crystallization at low temperature. And, it is still difficult to obtain an excellent photosensor high in density and fast in operation. In addition, there still remains pollution problems. In order to cope with this situation, there has been developed an amorphous silicon photosensor free of pollution problems, high in light absorption coefficient as well as in dark resistivity, excellent in photoconductivity, and easy in providing a large surface area as well as forming a thin film.

In accordance with a typical prior art amorphous silicon photosensor, a set of electrodes is formed on one surface of a substrate and an amorphous silicon layer is formed as extending between the electrodes. This type of prior art amorphous silicon photosensor is called a coplanar type amorphous silicon photosensor and a relatively large number of sample products have been experimentally manufactured because of its ease in manufacture. However, due to its structural constraints, the light response speed is relatively slow and there is difficulty in application to high-speed facsimiles. This is because, in the coplanar type amorphous silicon photosensor, the distance between a set of electrodes is required to be relatively large, i.e., in the order of 10 microns, so that it takes time for carriers, such as electrons, to move between the set of electrodes across the gap therebetween. In addition, since the set of electrodes is formed on the same plane, there is a limit in density as well.

In order to cope with this situation, there has also been developed a sandwich type amorphous silicon photosensor in which an amorphous silicon layer is sandwiched between a transparent electrode and another electrode. It is expected that this sandwich type amorphous silicon photosensor will provide a desired high-density and high-speed photosensor. However, in this sandwich type photosensor, since charge is injected from electrodes while a bias voltage is being applied between the electrodes, the dark current tends to be larger, so that there is a drawback of incapability of obtaining a large light and dark ratio (S/N ratio), which is a ratio between current with light and current without light. Amorphous silicon has a relatively large light absorption coefficient and thus it may be made in the form of a thin film (typically, ranging between 5,000 angstroms and 1 micron), which can contribute to provide a high-speed operation. However, when made in the form of a thin film, there is a possibility of shorting between the electrodes through pin holes in the thin film, thereby preventing another difficulty in providing high yields of photosensors which are uniform in characteristics.

In order to reduce the dark current of a sandwich type photosensor, there has also been proposed a MIS type amorphous silicon photosensor having a blocking structure for blocking the injection of charge from the electrodes by additionally providing a thin insulating film between amorphous silicon and the electrodes. An insulating film of silicon oxide, silicon nitride or metal nitride has been proposed for this purpose. For example, according to teachings of the Japanse Patent Laid-open Pub. No. 57-106179, it is proposed to subject the surface of amorphous silicon to anodic plasma oxidation to form a thin insulating film or to cause glow discharge in silane gas containing oxygen to form a silicon oxide film on the amorphous silicon. According to the teachings of this patent application, the preferred thickness of the resulting insulating film is in the order of 20-40 angstroms, and, thus, it is rather difficult to form such a film across the entire surface of high-density photoelectric elements uniformly in composition as well as in thickness. Because, if the thickness of a thin film is less than 100 angstroms, the resulting thin film tends to be patchy so that there is a difficulty in obtaining a uniform characteristic.

On the other hand, Japanese Patent Laid-open Pub. No. 56-26478 teaches the use of silicon nitride (light-transmitting, current-passing, insulating or semi-insulating), which is lower in resistivity than silicon oxide, as the above-described insulating thin film. In the case of silicon oxide, since it has a relatively large energy bandgap, it tends to resist the passage of current therethrough even if it is made in the form of a thin film, so that it is difficult for carriers to move across the thin film of silicon oxide during light irradiation. As a result, there is a drawback of difficulty in obtaining a high light and dark ratio (S/N ratio) in the case where use is made of silicon oxide. Under the circumstances, this patent application proposes to use silicon nitride, which has a smaller energy bandgap as compared with silicon oxide and which is lower in resistivity than silicon oxide. However, even according to the teachings of this patent application, the preferred thickness of a resulting silicon nitride thin film is in the order of 50-100 angstroms, so that there still remains difficulty in obtaining a photosensor uniform in characteristic.

In the case of fabricating a high-density photosensor, typically, individual electrodes are formed and then an insulating film is formed. In this case, the individual electrodes are formed by etching with a photolithographic technique prior to formation of the insulating film. However, since it is difficult to form a thin insulating film on the shoulder portion along a side edge defined by such etching, it is even more difficult to fabricate a photosensor having a uniform characteristic.

Furthermore, the Japanese Patent Laid-open Pub. No. 56-14268 discloses a photoconductive semiconductor device which includes a multi-layer structure of amorphous silicon, in which at least one layer of amorphous silicon includes oxygen and impurities for controlling charge density. However, if oxygen is present and the optical bandgap (Eg-opt) is widened, a photoconductive characteristic is shown; however, if the optical bandgap is further widened, no photoconductive characteristic is shown. In order to use a highly resistive thin film so as to block introduction of charge, it is necessary to used amorphous silicon having an optical bandgap of 2.0 eV; in this case, however, difficulty is presented for the carrier which has been generated upon irradiation of light to pass, so that a photosensor having a large light and dark ratio (S/N ratio) cannot be obtained. That is, under the current status, there has not been obtained amorphous silicon having a high resistance (i.e., large optical bandgap) and photoconductivity particularly suitable for use in a sandwich type amorphous silicon photosensor.

SUMMARY OF THE INVENTION

In accordance with the principle of the present invention, there is provided an amorphous silicon photosensor which comprises an amorphous silicon multi-layer structure which is sandwiched between a pair of first and second electrodes. The first electrode is comprised of an oxide material and has a transparency of 80% or more in a visible light region. The amorphous silicon multi-layer structure includes a first amorphous silicon layer which is adjacent to said first electrode and which includes at least one of atom constituting an electrode material of an oxide and oxygen, has a resistivity in a range of $10^{12}$–$10^{14}$ ohms-cm for an optical bandgap in a range of 2.0 eV or more, and has a refractive index in a range of 1.8–3.4.

It is therefore a primary object of the present invention to obviate the disadvantages of the prior art as described above and to provide an improved photosensor.

Another object of the present invention is to provide an improved amorphous silicon photosensor suitable for use as an image sensor for example in a facsimile.

A further object of the present invention is to provide an improved sandwich type photosensor having a large light and dark (S/N) ratio and uniform characteristic.

Other objects, advantages and novel features of the present invention will become apparent from the following detailed description of the invention when considered in conjunction with the accompanying drawings.

DESCRIPTION OF THE PREFERRED EMBODIMENTS

Figure 1:
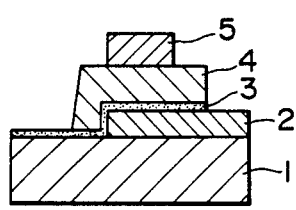
FIG. 1 is a schematic illustration showing in cross section a sandwich type amorphous silicon photosensor constructed in accordance with one embodiment of the present invention.
Figure 2:
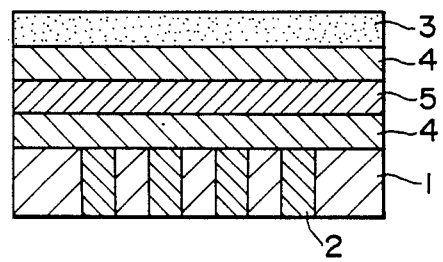
FIG. 2 is a schematic illustration showing in plan view the photosensor shown in FIG. 1.

Referring now to FIG. 1, there is shown in schematic, cross section a sandwich type amorphous silicon photosensor constructed in the form of an image sensor in accordance with one embodiment of the present invention and FIG. 2 illustrates schematically the plan view of the photosensor shown in FIG. 1. As shown, the present photosensor includes a transparent glass substrate 1 on which a transparent electrode 2 is formed, for example, from ITO or $SnO_2$ to the thickness of 800 angstroms. The transparent electrode 2 is typically patterned by etching to separate individual electrodes. With this, there is provided a sensor substrate structure. These individual electrodes 2 are provided at a predetermined pitch, and, for example, in the case of application to facsimiles, the individual electrodes 2 are provided, for example, at 8/mm or 16/mm. On this sensor substrate structure is formed a first amorphous silicon layer 3 which includes at least oxygen atoms and which has an optical bandgap in a range of 2.0 eV or more and a resistivity (photoconductivity) in a range of $10^{12}$–$10^{14}$ ohms-cm.

Of importance, the oxygen atoms to be contained in the first amorphous silicon layer 3 may be oxygen atoms alone, or a mixture of oxygen atoms and carbon atoms or of oxygen atoms and nitrogen atoms, or a mixture of oxygen, carbon and nitrogen atoms. In the preferred embodiment, the first amorphous silicon layer 3 is formed to the thickness in the order of 400 angstroms by glow discharge decomposition using a mixture gas containing hydrogen-diluted $SiH_4$ mixed with $CO_2$ alone or $CO_2$ and $N_2$. During manufacture of the first amorphous silicon layer 3, due to appropriately controlled glow discharge and the energy for heating the substrate structure, the atom constituting the transparent and electrically conductive electrode are doped into the resulting amorphous silicon layer by diffusion. If the transparent, conductive electrode is ITO, such atoms as In, Sn and O are doped. Although the first amorphous silicon layer 3 inherently contains oxygen atoms, there is defined a density distribution of oxygen at the interface of this layer 3 by this doping, so that there is formed a barrier for blocking introduction of electrons or holes. In addition, such atoms as In serve as group III atoms of the periodic table for the first amorphous silicon layer 3. Moreover, in the case of $SnO_2$, such atoms as Sn serve to strengthen the lattice bonding.

Then, using $SiH_4$ gas, on the first amorphous silicon layer 3 is formed a second amorphous silicon 4, which is not doped, to the thickness in the order of 1.5 microns, for example, by glow discharge decomposition. The amorphous silicon layers 3 and 4 may be patterned using masks during glow discharge decomposition deposition, or they may be patterned by photoetching after deposition. Thereafter, a second electrode 5 is formed on the second amorphous silicon layer 4 from an electrically conductive material to the thickness in the order of 1 micron. Preferably, the second electrode 5 is comprised of a metal, such as Al or Cr. The metal electrode 5 may also be patterned suitably, for example, by using a mask or photoetching in a manner similar to those used for patterning the amorphous silicon layers 3 and 4.

Figure 3:
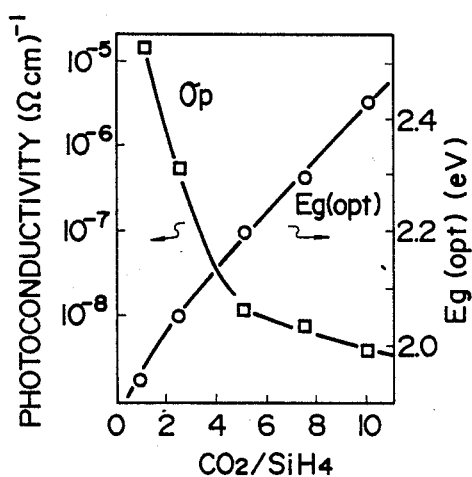
FIGS. 3 and 4 are graphs which are useful for understanding the electrical and optical characteristics of amorphous silicon used in the present photosensor.
Figure 4:
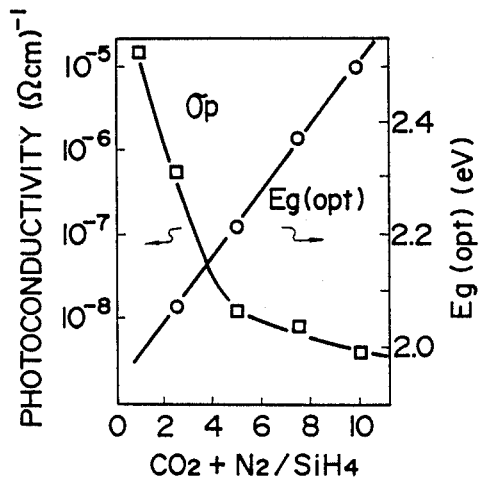

FIG. 3 graphically shows the characteristic of amorphous silicon which has been manufactured from a mixture gas of hydrogen-diluted $SiH_4$ and $CO_2$, which, thus, contains oxygen atoms or a combination of oxygen atoms and carbon atoms in amorphous silicon, and which has an optical bandgap of 2.0 eV of more and a resistivity in a range of $10^{12}$–$10^{14}$ ohms-cm. In particular, FIG. 3 shows a relation between the gas mixture ratio between $CO_2$ and $SiH_4$ during glow discharge and the optical bandgap and another relation between the gas mixture ratio and photoconductivity under pseudo sunlight irradiation of AM1 100 mW/cm². On the other hand, FIG. 4 illustrates similar relationships for the case in which use is made of a mixture gas containing hydrogen-diluted $SiH_4$, $CO_2$ and $N_2$ during glow discharge decomposition. As easily understood from these graphs of FIGS. 3 and 4, as the ratio of $CO_2/SiH_4$ or $(CO_2+N_2)/SiH_4$ increases, the optical bandgap broadens substantially linearly. On the other hand, the photoconductivity decreases until the gas mixture ratio of $CO_2/SiH_4$ or $(CO_2+N_2)/SiH_4$ increases approximately to 5; however, after the gas mixture ratio =5, the rate of decrease becomes smaller, i.e., in the order of $10^{-8}$ (ohms-cm$^{-1}$). Besides, although not shown specifically, the dark conductivity rapidly decreases until the gas mixture ratio increases approximately 2.5, but, above 2.5, the rate of decrease becomes extremely smaller in the order of $10^{-13}$–$10^{-14}$ (ohms-cm)$^{-1}$, which may be regarded as substantially constant. Thus, it can be seen that the present amorphous silicon to be used in the present invention, which contains oxygen atoms and has an optical bandgap of 2.0 eV or more, exhibits a photoconductive characteristic.

When this amorphous silicon is used as the first amorphous silicon layer 3 in contact with the first electrode 2, there is provided an excellent function for blocking introduction of charge from the first electrode 2 during a dark period by an extremely high resistivity in a range of $10^{12}$–$10^{14}$ ohms-cm and a barrier by a broad optical bandgap in a range of 2.0 eV or more. In addition, during a light period or irradiation with AMI 100 mW/cm², the resistivity is low and in a range of $10^7$–$10^8$ ohms-cm, thereby providing a function for easing passage of the carriers produced by light irradiation, so that there can be easily obtained an extremely high S/N ratio. Because of high level of photoconductivity, the prior art oxide and nitride films were required to have a thickness in a range of 20–100 angstroms, which presented difficulty in obtained a uniform characteristic; on the other hand, in the present invention, each of the amorphous silicon layers 3 and 4 may be formed to the thickness in a range of 200–2,000 angstroms, preferably in a range of 300–700 angstroms, or most preferably in a range of 300–500 angstroms, so that there can be provided a photosensor having a uniform characteristic.

In the present invention, if use is made of a mixture gas of $SiH_4$ and $CO_2$ as the start gas, the carbon atoms produced by decomposition of $CO_2$ gas are contained in the resulting amorphous silicon film by a minute amount, and it is primarily the oxygen atoms contained in the resulting amorphous silicon film that determines the characteristic of the resulting amorphous silicon film having an optical bandgap of 2.0 eV or more and a photoconductive characteristic. On the other hand, as the start gas, use may also be made of a mixture gas of $SiH_4$, $CO_2$ and $N_2$, in which case, $CO_2$ is a source of oxygen atoms to be contained in the resulting amorphous silicon film and $N_2$ is a source of nitrogen atoms to be contained in the film. In this case, since not only $CO_2$ but also $N_2$ are used, more oxygen atoms tend to be contained in the resulting film as compared with the case in which only $CO_2$ alone is used. As a result, there can be obtained a wider optical bandgap and the resulting film is more dense because of the presence of nitrogen atoms, which contributes to improve the effects of blocking against charge injection.

Figure 5:
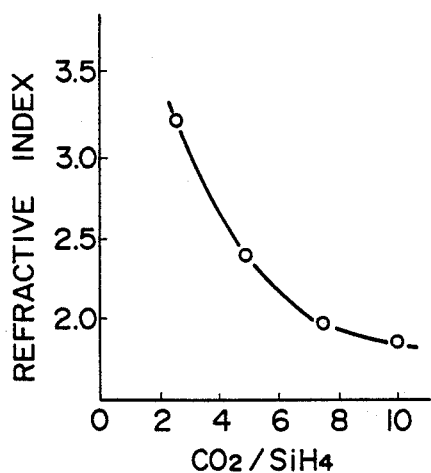
FIG. 5 is a graph showing a relationship between the gas ratio and the refractive index of the amorphous silicon used in the present photosensor.

FIG. 5 is a graph showing the characteristic of an amorphous silicon film for use in the present invention, containing at least oxygen atoms and having an optical bandgap in a range of 2.0 eV or more, a refractive index in a range of 1.8–3.4 and a photoconductive characteristic. In particular, the graph of FIG. 5 shows a relationship between the gas mixture ratio of $CO_2/SiH_4$ at the time of formation of the amorphous silicon film and the refractive index of the film. As shown in FIG. 5, as the ratio of $CO_2/SiH_4$ increases, the refractive index gradually decreases. In this manner, by suitably adjusting the mixture ratio of $CO_2/SiH_4$, the refractive index of the resulting amorphous silicon film may be suitably matched with the refractive index of the substrate or any other related film, whereby the light input efficiency can be enhanced, which, in turn, contributes to enhance the photoelectric conversion efficiency of a photosensor.

Figure 6:
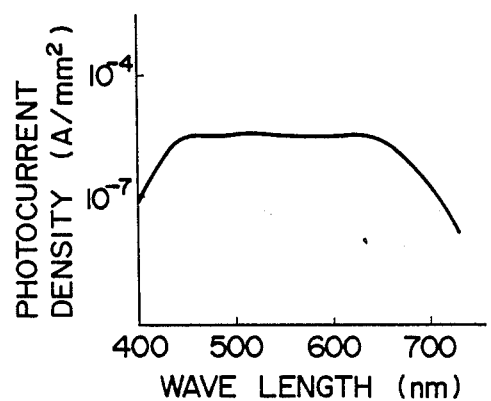
FIG. 6 is a graph showing a spectral sensitivity distribution of the amorphous silicon used in the present photosensor.

FIG. 6 graphically illustrates one example of the spectral sensitivity distribution characteristic of an amorphous silicon photosensor constructed in accordance with another embodiment of the present invention. The photosensor of this embodiment is similar in physical structure in many respects to the photosensor shown in FIG. 1; however, on the transparent glass substrate 1 is formed the first transparent electrode 2 from ITO to the thickness of approximately 800 angstroms, which is then selectively etched using a well-known photolithographic technique to form individual electrodes, thereby providing a sensor substrate structure. These individual electrodes each have the size of 100 microns × 100 microns and the spacing between the two adjacent individual electrodes is 25 microns. On this sensor substrate structure is formed the first amorphous silicon layer 3, which contains oxygen atoms and has an optical bandgap of 2.15 eV and a photoconductive characteristic, using a mixture gas of hydrogen-diluted $SiH_4$ and $CO_2$ to the thickness of 350 angstroms by glow discharge decomposition. Then, using a gas of hydrogen-diluted $SiH_4$, the second amorphous silicon layer 4, which is not doped, is formed to the thickness of 1.25 microns. The first and second amorphous silicon layers 3 and 4 are formed using deposition masks. Thereafter, the Al electrode 5 is formed by mask vapor deposition to provide an amorphous image sensor. In the graph of FIG. 6, the abscissa is taken for light wave length and the ordinate is taken for photocurrent density (A/mm²) As shown, because the first amorphous silicon layer 3 has a relatively wide optical bandgap, sensitivity is increased in a short wave length region, and an extremely uniform photocurrent density is obtained over a wide range of optical wave-length, i.e., 400 nm–630 nm.

Figure 7:
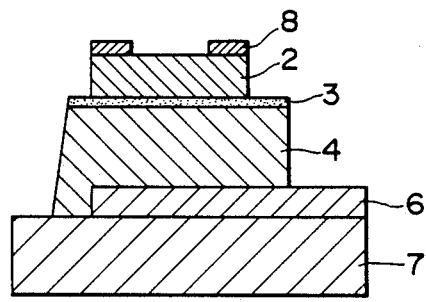
FIG. 7 is a schematic illustration showing in cross section a sandwich type amorphous silicon photosensor constructed in accordance with another embodiment of the present invention.

FIG. 7 shows another sandwich type amorphous silicon photosensor constructed in accordance with a further embodiment of the present invention. This embodiment is of the type in which light is incident upon a side which is opposite to the side where a substrate is provided. As shown, the present photosensor includes an electrically insulating substrate 7 which may, for example, be comprised of ceramic, glass or a metal having an insulating material, such as $SiO_2$ or $Al_2O_3$, at a surface thereof. On the substrate 7 is formed a metal electrode 6 which is typically formed to include a plurality of individual electrodes arranged in a line at predetermined intervals. The electrode 2 is typically formed from a metal, such as Cr or NiCr, as deposited, for example, by evaporation or sputtering, and the thus deposited metal is selectively etched by a photolithographic technique to define a pattern of individual electrodes. In the case of application to an image sensor of facsimiles, these individual electrodes may be formed at the resolution of 8/mm or 16/mm.

On the sensor substrate structure is then formed a non-doped amorphous silicon layer 4 to the thickness of approximately 1.5 microns by glow discharge decomposition using $SiH_4$ gas. Then, using a mixture gas including $SiH_4$, $CO_2$ and $N_2$, another amorphous silicon layer 3 is formed by glow discharge decomposition to the thickness of approximately 400 angstroms on the non-doped amorphous silicon layer 4. The resulting amorphous silicon layer 3 contains both of oxygen and nitrogen and has an optical bandgap of 2.0 eV or more and a resistivity (and photoconductively) in a range of $10^{12}$–$10^{14}$ ohms-cm. The amorphous silicon layers 3 and 4 may be formed by using masks during glow discharge decomposition deposition, or, alternatively, deposition may be made first and then patterning may be carried out using a photolithographic technique. Thereafter, a transparent, electrically conductive film 2 is formed from ITO or $SnO_2$ to the thickness of approximately 800 angstroms. Finally, a light-shielding mask 8 is formed to have a desired pattern in the form of a thin film from a metal, such as Cr. Thus, there is provided a photosensor. For example, the size of an opening defined by the light-shielding mask 6 may have a width of 100 microns in the case of the resolution of 8 individual electrodes/mm. The resulting amorphous silicon photosensor has an extremely high light and dark ratio (S/N ratio) and has a characteristic which is substantially identical to that of the embodiment shown in FIG. 1.

In the present invention, as a method for forming the first amorphous silicon layer 3 containing at least oxygen atoms and having an optical bandgap in a range of 2.0 eV or more, a refractive index in a region of 1.8–3.4 and a photoconductive characteristic, a glow discharge method or a sputtering method is preferred. In addition, as a gas material for forming an amorphous silicon layer, use may be made of such gas as $SiH_4$, $Si_2H_6$, $SiD_4$, $Si_2D_6$, $SiF_4$, or $SiCl_4$, which is diluted with hydrogen, helium or argon or without dilution. As a gas material for containing amorphous silicon of the amorphous silicon layer 3, use is made of a gas which contains oxygen and produces oxygen when decomposed by glow discharge and which preferably includes CO, $CO_2$, NO, $N_2O$ and $NO_2$. The preferred range of amount of contents of oxygen in the film is 2 to 30 at. %. On the other hand, regarding nitrogen, use may be preferably made of $N_2$ or $NH_3$, and the preferred range of amount of contents of nitrogen in the film is 0.5 to 10 at. %. Besides, as a gas containing oxygen and nitrogen, use may be preferably made of such gas as NO or $N_2O$.

A junction between the transparent, conductive electrode, for example, of ITO and the amorphous silicon layer 3 is defined by a contact between different materials, there tend to be produced trap levels. In order to reduce these levels and to prevent the introduction of carriers from the electrode under dark condition, group III or V elements may be introduced into the amorphous silicon layer 3. The selection of a particular group III or V element is determined by the voltage applied to the electrode. In the case where a negative voltage is applied to the transparent, conductive electrode to which light in incident and a positive voltage is applied to the opposite electrode, it is preferable to introduce a group III element into the amorphous silicon layer. This is because, this element serves as a barrier against the negative voltage and allows the holes of photo-carriers produced in the amorphous silicon layer 3 or non-doped amorphous silicon layer 4 to move toward the transparent, conductive electrode efficiently. Similarly, in the case where a positive voltage is applied to the transparent, conductive film, it is preferably to use a group V element. In addition, in this case, a minute amount of a group III element may be added to the amorphous silicon layer 4 so as to promote the movement of photo-carriers. As a group III element, such element as B or In is preferred. In the case where use is made of ITO or the like as the transparent, conductive film, it is not necessary to separately dope the amorphous silicon layer 3 with a group III element so as to introduce In, which is an element to constitute ITO, by controlling the film manufacturing conditions. As a group V element, such element as P or As is preferred. The concentration distribution of the doping layer with this group III or V element preferably decrease continuously or discontinuously from the interface of ITO/amorphous silicon layer 3, and this distribution may extend across the entire region of the amorphous silicon layer 3 or a part thereof. The concentration of a group III element is preferred to be in a range of $5 \times 10^4 - 5$ at. % at its maximum. Similarly, in the case of a group V element, its concentration is preferred to be in a range of $1 \times 10^{-4} - 3$ at. %. As a start gas of a group III element, use is preferably made of $B_2H_6$ or $BCl_3$; whereas, as a start gas of a group V element, use is preferably made of $PH_3$ or $POCl_3$.

As the first electrode which is electrically conductive and allows transmission of light therethrough, use is preferably made of such material as ITO or $SnO_2$, but use may also be made of an extremely thin metal, such as Pt or Au, or silicide, such as PtSi. These electrodes define a hetero junction or Schottky junction with an amorphous silicon layer of the present invention, and, thus, there is formed a barrier which blocks the introduction of electrons or holes, so that the injection of charge from the electrode during dark period may be reduced suitably, thereby allowing to minimize the dark current. These materials may be deposited by any well known deposition method, including evaporation and sputtering.

As the second electrode, use may be made of a metal, such as Al, NiCr, Cr, Mo, W, Ag, or Ti, or the second electrode may have a two-layer structure, such as a first sublayer of polysilicon and a second sublayer of microcrystalline silicon. Similarly with the junction between the first electrode and the amorphous silicon layer 3, trap levels are also produced at the junction between the second electrode and the amorphous silicon layer 4, so that a group III or V element may also be doped continuously or discontinuously at the side of the amorphous silicon layer 4 at the interface between the second electrode and the amorphous silicon layer 4. In addition, since the second electrode is a metal electrode, if the Schottky barrier is too low or unstable due to film manufacturing conditions, in order to increase the height of a barrier, an additional amorphous silicon layer to which oxygen has been added and which has an optical bandgap in a range of 2-3 eV and a thickness in a range of 100–500 angstroms may be inserted between the second electrode and the amorphous silicon layer 4.

In the present invention, as shown in FIG. 7, in order to cause the light which has not been absorbed by the amorphous silicon to be rereflected to increase the photoelectric conversion efficiency, a metal having a high reflecting coefficient may deposed on the substrate and patterned to define the second electrode 6. On the second electrode 6 is formed the amorphous silicon layer 4, amorphous silicon layer 3 and the first electrode 2 one on top of another in the order mentioned.

The following are some specific examples of the present invention.

EXAMPLE 1

On a pyrex glass substrate, each layer was formed in the order described under the conditions indicated.

(1) First Electrode

Evaporation: ITO (vacuum deposition) 800 angstroms.

Photolithography: formation of individual electrodes of 100 microns by HCl.

(2) First Amorphous Silicon Layer

Gas ratio: $CO_2/SiH_4 = 5$, $SiH_4/H_2 = 1 \times 10^{-1}$.
Total gas flow rate: 175 SCCM.
RF power: 8 W.
Pressure: 1.0 Torr.
Film thickness: 350 angstroms.

(3) Amorphous Silicon Layer

Gas ratio: $SiH_4/H_2 = 1 \times 10^{-1}$.
Total gas flow rate: 100 SCCM.
RF power: 8 W.
Pressure: 1.0 Torr.
Film thickness: 1.25 microns.

(4) Second Electrode

Evaporation: Al (vacuum deposition) 5,000 angstroms.

Using the resulting structure, when the dark current was measured with the Al electrode grounded and $-5$ V applied to the ITO electrode, $Id = 1.1 \times 10^{-11}$ $(A/mm^2)$ was obtained. On the other hand, with the irradiation or light having the wave length of 550 nm and 100 lux, photocurrent of $Ip = 1.6 \times 10^{-7}$ $(A/mm^2)$ was obtained. And, thus, there was obtained a ratio of $Ip/Id = 1.45 \times 10^4$, which was extremely high.

EXAMPLE 2

The conditions were almost identical to those of the above-described example 1 excepting the use of gases for forming the first amorphous silicon layer at step (2). In the present example, use was made of $CO_2$, $N_2$ and $SiH_4$ under the following conditions.

Gas pressure: $CO_2/SiH_4 = 5, N_2/CO_2 \times 1$, and $SiH_4/H_2 = 1 \times 10^{-1}$.

As a result, there was obtained a result identical to that obtained in the example 1 above.

EXAMPLE 3

On a pyrex glass substrate, each layer was formed in the order described under the conditions indicated.

(1) First Electrode

Sputter: $SnO_2$, 3,000 angstroms.

Photolithography: formation of individual electrodes of 100 microns by HCl.

(2) First Amorphous Silicon Layer

During deposition to the film thickness of 500 angstroms for five minutes, $B_2H_6$(500 ppm/$H_2$)/$SiH_4 = 0.1$ was added in addition to the following conditions for the first one minute and the deposition was continued with the following conditions for the remaining four minutes.

Gas pressure: $CO_2/SiH_4 = 5$, $SiH_4/H_2 = 1 \times 10^{-1}$.
Total gas flow rate: 175 SCCM.
RF power: 10 W.
Pressure: 1 Torr.
Film thickness: a-Si:O:H (B doped) 100 angstroms a-Si:O:H (non-dope) 400 angstroms (continuous film formation)

(3) Amorphous Silicon Layer

Gas pressure: $SiH_4/H_2 = 1 \times 10^{-1}$.
Total gas flow rate: 100 SCCM.
RF power: 8 W.
Pressure: 1 Torr.
Film thickness: 1.5 microns.

(4) Second Electrode

Sputter: Cr, 5,000 angstroms.

Using the resulting structure, when the dark current was measured with the Cr electrode grounded and $-5$ V applied to the ITO electrode, $Id = 5 \times 10^{-12} (A/mm^2)$ was obtained. On the other hand, with the irradiation of light having the wave length of 550 nm and 100 lux, the photo-current of $Ip = 2 \times 10^{-7}$ $(A/mm^2)$ was obtained, so that there was obtained a Ip/Id ratio of $4 \times 10^4$, which was extremely high.

EXAMPLE 4

On a pyrex glass substrate, each layer was formed in the order described under the conditions indicated.

(1) Second Electrode

Sputter: Cr, 5,000 angstroms.

(2) Amorphous Silicon Layer

Gas pressure: $SiH_4/H_2 \times 1 \times 10^{-1}$.
Total gas flow rate: 100 SCCM.
RF power: 8 W.
Pressure: 1 Torr.
Film thickness: 1.25 microns.

(3) First Amorphous Silicon Layer

Gas pressure: $CO_2/SiH_4 \times 5$, $SiH_4/H_2 \times 1 \times 10^{-1}$.
Total gas flow rate: 175 SCCM.
RF power: 8 W.
Pressure: 1.0 Torr.
Film thickness: 250 angstroms.

(4) First Electrode

Sputter: $SnO_2$, 750 angstroms.

Photolithography: formation of individual electrodes of 100 microns by HCl.

Using the resulting structure, when the dark current was measured with the Al electrode grounded and $-5$ V applied to the ITO electrode, $Id = 5 \times 10^{-11} (A/mm^2)$ was obtained. On the other hand, with the irradiation of light having the wave length of 550 nm and 100 lux, the photo-current of $Ip = 2 \times 10^{-7}$ $(A/mm^2)$ was obtained, so that there was obtained a Ip/Id ratio of $4 \times 10^3$, which was extremely high.

As described above in detail, in accordance with the present invention, there is provided an sandwich type amorphous silicon photosensor which comprises a pair of first and second electrodes and an amorphous silicon multi-layer structure sandwiched between the pair of first and second electrodes. The amorphous silicon multi-layer structure includes a first amorphous silicon layer in contact with the first electrode layer which includes an oxide and a light-transmitting efficiency or transparency of 80% of more in a visible light region, and the first amorphous silicon layer contains at least one kind of atoms constituting an electrode material of the oxide and oxygen atoms and has an optical bandgap in a range of 2.0 eV or more, a resistivity in a range of $10^{12}$–$10^{14}$ ohms-cm and a photoconductive characteristic. With this structure, during application of a bias voltage and under a dark condition, the injection of charge from the electrode is blocked by the extremely high resistivity of $10^{12}$–$10^{14}$ ohms-cm of the first amorphous silicon layer in contact with the first electrode, so that the dark current is minimized. In addition, the first amorphous silicon has a sufficient photoconductive characteristic to allow the carriers produced during irradiation of light to pass therethrough, so that a relatively large photocurrent can be obtained with irradiation. As a result, there is obtained an extremely high Ip/Id ratio.

In addition, since the first amorphous silicon layer in contact with the first electrode has a photoconductive characteristic, it can be formed thicker than the conventional layer using an oxide or nitride by the factor of five to 10, so that there can be provided a photosensor uniform in characteristic in its entirety. Furthermore, in an amorphous silicon layer of the present invention, the optical bandgap may be varied at will at 2.0 eV or above while retaining the photoconductive characteristic, so that the light having shorter wave lengths which is absorbed within this optical bandgap may be utilized effectively, thereby allowing to make the spectral sensitivity distribution of the amorphous silicon photosensor sufficiently flat over a wide range of wave lengths. This permits to apply the present photosensor as a color image sensor.

Incidentally, in the case where use is made of ITO as a material for forming the first electrode when forming an amorphous silicon layer containing at least oxygen atoms, if a glow discharge decomposition method is used for $SiH_4$ for formation of the amorphous silicon layer, there may be a case in which ITO is reduced to thereby deteriorate the characteristic of ITO; however, in the present invention, by introduction of a compound which produces oxygen atoms by decomposition during glow discharge, such as $CO_2$, since oxygen is produced during glow discharge decomposition, the reduction of ITO is suppressed, so that the characteristic of ITO is well prevented from being deteriorated.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A photosensor comprising:
   a pair of first and second electrodes, said first electrode containing at least one metal oxide and being transparent and a voltage being applied between said first and second electrode to detect a photocurrent; and
   an amorphous silicon multi-layer structure sandwiched between said pair of first and second electrodes, said multilayer structure comprising at least one first amorphous silicon layer which is in contact with said first electrode, which is doped with at least one of the metal elements which constitutes the electrode material of said first electrode and with oxygen atoms, and which has an optical bandgap in a range of 2.0 eV or above, a resistivity in a range of $10^{12}$–$10^{14}$ ohms-cm, a photoresistivity in a range of $10^7$–$10^8$ ohms-cm at AM 1100 $mW/cm^2$ and a refractive index within the range of 1.8–3.4, and at least one second amorphous silicon layer, in surface contact with said second electrode, which is undoped.

2. The photosensor of claim 1, wherein said first electrode has a transparency of 80% or more.

3. The photosensor of claim 2, further comprising a substrate on which one of said pair of first and second electrodes is formed.

4. The photosensor of claim 3, wherein the electrode formed on said substrate is comprised of a plurality of individual electrodes spaced apart at predetermined intervals.

5. The photosensor of claim 3, wherein said substrate is transparent.

6. The photosensor of claim 1, wherein said first electrode is formed from a member selected from the group consisting of ITO and $SnO_2$.

7. The photosensor of claim 2, wherein said first electrode is a thin layer of a material selected from the group consisting of metal and a silicide.

8. The photosensor of claim 7, wherein said metal is a member selected from the group consisting of Pt and Au and said silicide is PtSi.

9. The photosensor of claim 1, wherein said multilayer structure has two layers one of which is said first amorphous silicon layer containing oxygen and the remaining layer is an undoped amorphous silicon layer.

10. The photosensor of claim 9, wherein said second electrode is formed of a metal.

11. The photosensor of claim 10, wherein said metal is a member selected from the group consisting of Al, Cr, NiCr, Mo, W, Ag and Ti.

12. The photosensor of claim 9, wherein said second electrode has a two-layer structure of a first sublayer of polycrystalline silicon and a second sublayer of nmicrocrystalline silicon.

13. The photosensor of claim 1, wherein the amount of oxygen in said amorphous silicon layer ranges from 2 to 30 at omic %.

14. The photosensor of claim 1, wherein said first amorphous silicon layer contains nitrogen in an amount ranging from 0.5 to 10 atomic percent.

* * * * *